United States Patent [19]

Sato

[11] Patent Number: 5,424,247
[45] Date of Patent: Jun. 13, 1995

[54] METHOD FOR MAKING CONTACT HOLES IN SEMICONDUCTOR DEVICES

[75] Inventor: Natsuki Sato, Tokyo, Japan

[73] Assignee: NEC Corporation, Tokyo, Japan

[21] Appl. No.: 924,497

[22] Filed: Aug. 4, 1992

[30] Foreign Application Priority Data

Aug. 6, 1991 [JP] Japan .................................. 3-196345

[51] Int. Cl.⁶ ............................................. H01L 21/44
[52] U.S. Cl. ................................... 437/195; 437/981;
 437/947; 437/228
[58] Field of Search ............... 437/195, 228, 947, 981;
148/DIG. 161; 156/644

[56] References Cited

U.S. PATENT DOCUMENTS

| 4,363,830 | 12/1982 | Hsu et al. | 437/203 |
|---|---|---|---|
| 4,489,481 | 12/1984 | Jones . | |
| 5,087,591 | 2/1992 | Teng | 437/233 |
| 5,169,801 | 12/1992 | Sato | 437/231 |
| 5,342,808 | 8/1994 | Brigham et al. | 437/195 |

Primary Examiner—Olik Chaudhuri
Assistant Examiner—C. Everhart
Attorney, Agent, or Firm—Burns, Doane, Swecker & Mathis

[57] ABSTRACT

In a method for making contact holes in a semiconductor device according to the invention, a first insulating film is deposited on a semiconductor chip, a plurality of contact holes are formed by sequentially performing isotropic etching and anisotropic etching, a second insulating film is deposited after the portions of the first insulating film constituting peripheries of the contact holes are subjected to a reflow process, and residue sidewall insulators are formed for the contact holes by keeping portions of the second insulating film only at sidewall portions of the contact holes when the second Insulating film is etched-back by an anisotropic etching process. The structure thus obtained enables to provide the contact holes whose peripheral edges are gently tapered thereby improving the step coverage of the Interconnect wiring material at the contact hole portions. This enables to avoid a possibility for the interconnect wiring layer to be broken, which may otherwise be caused by a poor step coverage of the interconnect wiring layer. The method enhances the production yield in the fabrication of the device and also enhances the reliability of the product.

18 Claims, 4 Drawing Sheets

F I G. 2G
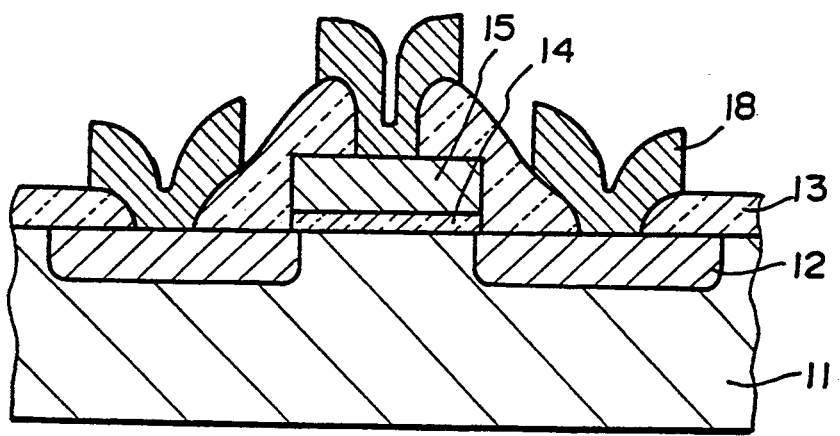

METHOD FOR MAKING CONTACT HOLES IN SEMICONDUCTOR DEVICES

BACKGROUND OF THE INVENTION (1) Field of the Invention

The present invention relates to a method of fabricating a semiconductor device, and more particularly to a method for forming contact holes in a semiconductor device.

(2) Description of the Related Art

A typical example of a conventional method for forming contact holes in a semiconductor device is first explained to assist the understanding of tile present invention. FIGS. 1A through 1C are cross-sectional elevated views of a conventional structure for explaining the process sequence employed in the fabrication of an n-channel MOS FET.

As shown in FIG. 1A, a p-type semiconductor substrate 21 is provided with n+-type diffusion layers 22 serving as source/drain regions formed in a surface region thereof, a gate insulating film 24 formed on a surface of the semiconductor substrate 21, a gate electrode 25 formed on the gate insulating film 24, and a boron phosphosilicate glass (BPSG) insulating film 23a formed with BPSG deposited over the semiconductor substrate 21 by a chemical vapor deposition (CVD) technique. If the BPSG insulating film 23a thus formed is left as it is, a poor step coverage of Interconnect material results so that the BPSG insulating film 23a is subjected to a heating reflow process (hereinafter referred to as "reflow process") thereby forming a smoothed BPSG insulating film 23, as shown in FIG. 1B.

Next, after a lithography process is applied, a procedure for forming contact holes is carried out at desired positions of the BPSG insulating film 23. First, the BPSG insulating film 23 is subjected to an isotropic etching (wet-etching) using hydrofluoric acid thereby forming upper portions of the contact holes and then is subjected to an anisotropic etching using a reactive ion-etching (dry etching) technique thereby forming lower portions of the contact holes which extend to the surfaces of the n+-diffusion layers 22 and the gate electrode 25, respectively. Further, in order to improve the step coverage of conductive interconnects, the edges 26 of contact holes are rounded by a reflow process, and after aluminum layers are deposited, the layers undergo a patterning process whereby the aluminum interconnects 28 are formed as shown in FIG. 1C.

In the conventional method for forming contact holes as explained above, the wet etching process and the contact hole reflow process are combined to improve the step coverage of conductive interconnects. However, although such a method has been confirmed to be effective for rounding the peripheral edges 26 of tile contact holes, the improvement in step coverage of tile conductive interconnects was shown to be only about 3% since the step coverage obtained by that method without any fellow process was about 10% while that obtained with the reflow process was about 13%. Consequently, for a deep contact hole such as the contact hole on the gate electrode 25, there is a possibility that the aluminum interconnect 28 may be fractured thereby giving a rise to serious reliability problems.

Problems in the conventional method explained above were that, with the deep contact holes formed for such electrodes as the gate electrodes 25, the conductive interconnects resulted in a poor step coverage and had a potential risk of being broken. Thus, conventionally, a method employed to improve the step coverage was to apply a reflow process to the edges 26 of the contact holes after the formation of tile contact holes. However, although this reflow process was effective for rounding the edges 26 of the contact holes, the step coverage improvement by this method alone was not sufficient since it was about 3% better than when the fellow process was not used. Also, in a structure such as a MOS memory device having a stacked capacitor cell, the arrangement was such that, in view of the structural nature, a storage capacitor is formed at an upper layer portion and a stacked electrode was made thick to ensure as large a storage capacity as possible. As a result, each of the interlayer insulating films unavoidably became thick so that the aspect ratio of the contact holes (ratio between the depth of a contact hole and the diameter of its bottom) was high and the step coverage of the contacts was poor, so that the contact reflow process alone was not sufficient for eliminating a risk of possible interconnect breakage. These problems in the conventional method are to be solved by the present invention.

SUMMARY OF THE INVENTION

It is, therefore, an object of the present invention to overcome the above explained problems and to provide an improved method of fabricating a semiconductor device which is highly reliable with an improvement in a step coverage of conductive interconnects.

According to one aspect of the invention, there is provided a method for making contact holes in a semiconductor device comprising the steps of:

depositing on a conductive layer of a semiconductor chip a first insulating film composed of a silicon oxide film containing phosphorus or boron;

heating and reflowing tile first insulating film;

forming contact holes at desired positions of the first insulating film by sequentially performing isotropic etching and anisotropic etching;

heating and reflowing peripheral edges of the contact holes constituted by the first insulating film;

depositing a second insulating film over an entire upper surface resulting from the steps so far carried out;

etching-back the second insulating film by an anisotropic etching process; and forming, during the etching-back, residue insulators constituted by portions of the second insulating film left only at sidewall portions of the contact holes.

BRIEF DESCRIPTION OF THE DRAWINGS

The above and other objects, features and advantages of the present invention will be apparent from the following description of a preferred embodiment of the invention explained with reference to the accompanying drawings, in which:

FIGS. 2A through 2G are cross-sectional elevation views of a structure illustrating sequential steps of the method of an embodiment according to the present invention.

DESCRIPTION OF THE PREFERRED EMBODIMENT

Now, a preferred embodiment of the invention is explained with reference to the appended drawings.

FIGS. 2A through 2G are cross-sectional elevated views of a semiconductor structure for explaining the process sequence employed in the fabrication of an n-channel MOS FET.

Figure 1A:
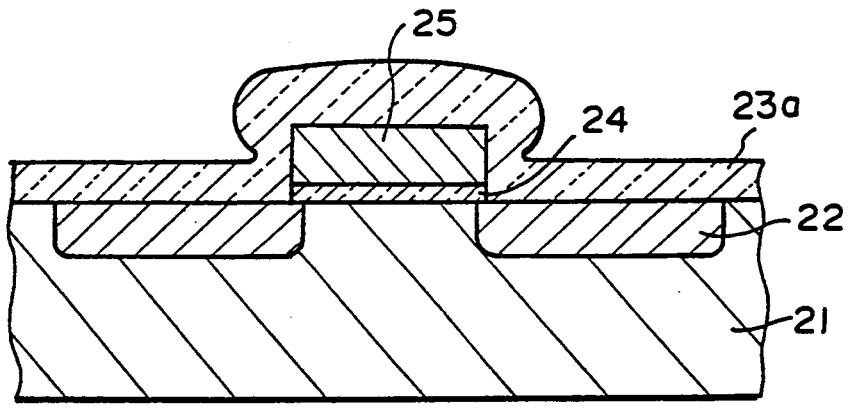
FIGS. 1A through 1C are cross-sectional elevation views of a structure illustrating sequential steps of the method of the prior art.
Figure 1B:
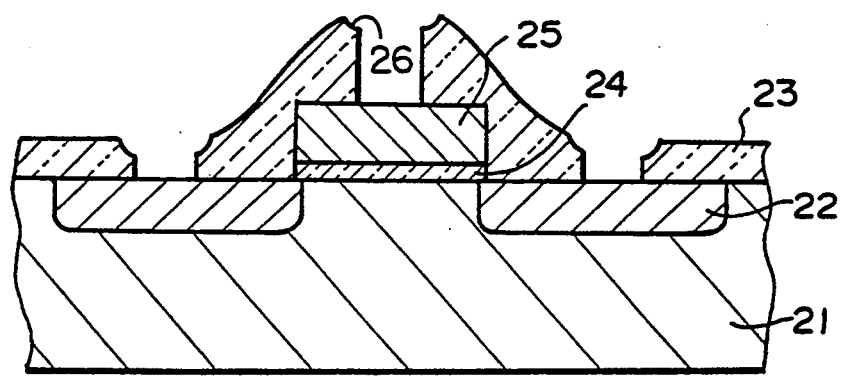
Figure 1C:
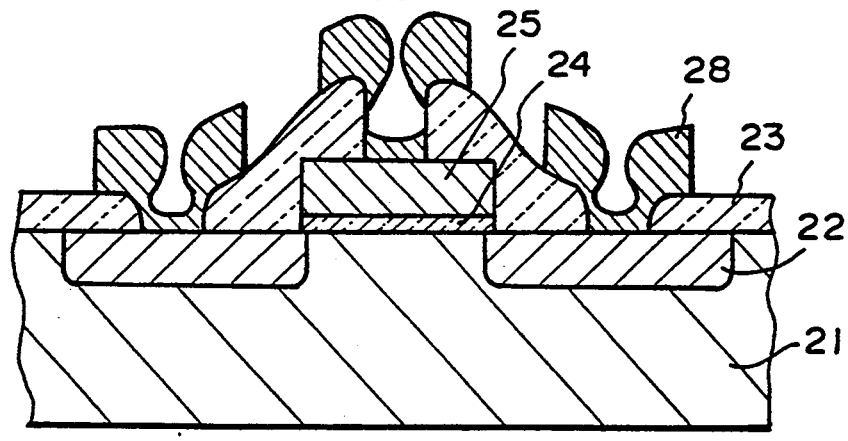
Figure 2A:
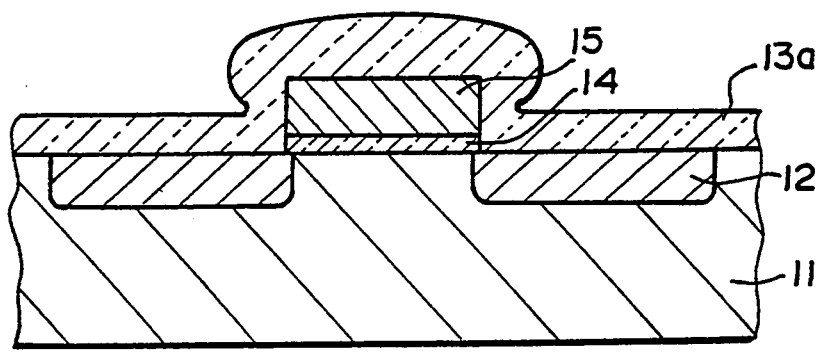

As shown in FIG. 2A, a p-type semiconductor substrate 11 is provided with n+-diffusion layers 12 serving as source/drain regions formed in the main surface of such substrate by diffusion of arsenic (As), a gate insulating film 14 formed by thermal oxidation of the main surface of the p-type semiconductor substrate, and a gate electrode 15 formed with a polysilicon film deposited on the gate insulating film 14 and then patterned by a photolithography technique. Then, BPSG-containing phosphorus and boron in a concentration of 5-10 mole percents each is deposited on the semiconductor chip to a thickness of 1.0 μm by a chemical vapor deposition (CVD) technique thereby forming a BPSG insulating film 13a.

Figure 2B:
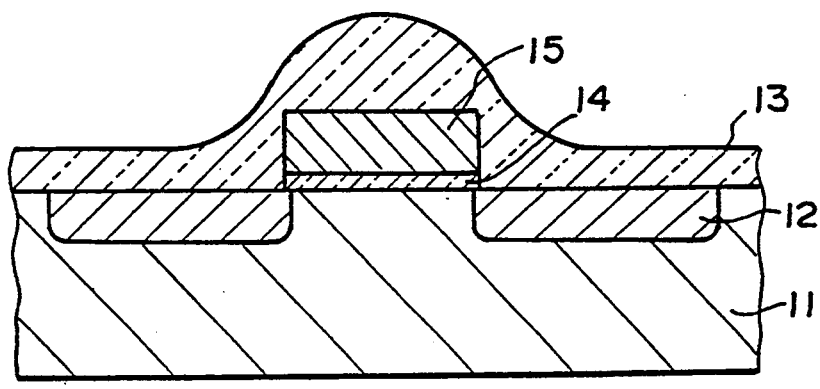

The BPSG insulating film 13a thus formed is subjected to a reflow process for 10 minutes in an atmosphere of $N_2$ gas at 900° C. thereby forming a first insulating film 13 with a smooth surface as shown in FIG. 2B.

Figure 2C:
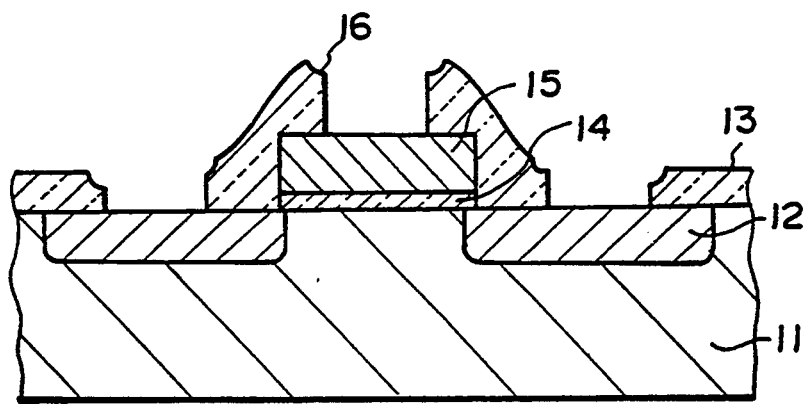

Next, as shown in FIG. 2C, following a lithography process, the process for opening contact holes at desired positions of the first insulating film 13 is carried out. For the contact holes, an isotropic etching using dilute hydrofluoric acid is employed to make holes having a depth of about 300 nm and then an anisotropic etching using a reactive ion-etching technique is employed to form the contact holes whose upper edge portions are wider at their tops.

Figure 2D:
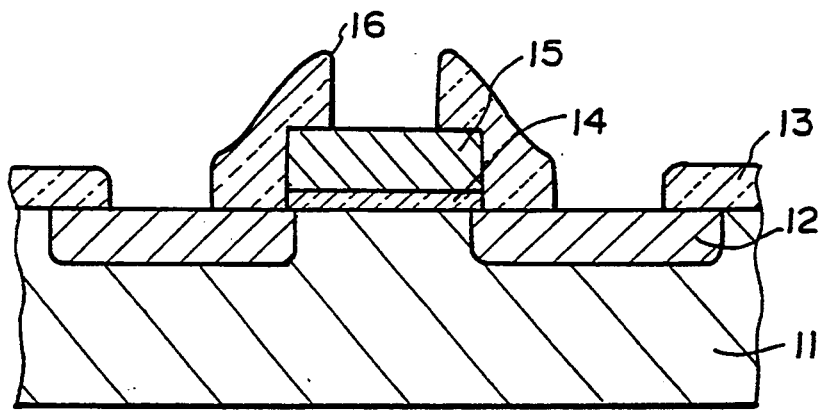

Then, as shown in FIG. 2D, a reflow process is carried out in order to round the upper edges 16 of the contact holes. This is done for 10 minutes in the $N_2$ gas atmosphere at 850° C.

Figure 2E:
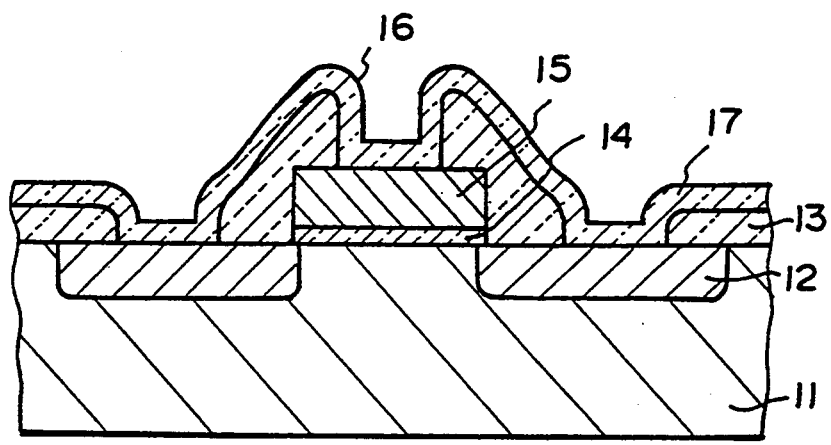

Next, as shown in FIG. 2E, by using a low pressure CVD technique at 850° C., a 150 nm thick silicon oxide ($SiO_2$) film is deposited as a second insulating film 17 having good quality coverage. The method used to form this second insulating film 17 is not limited to the low pressure CVD technique, since other deposition methods, such as a CVD method using $Si(OC_2H_5)_4$ gas, can be used as long as they satisfy the required coverage quality.

Figure 2F:
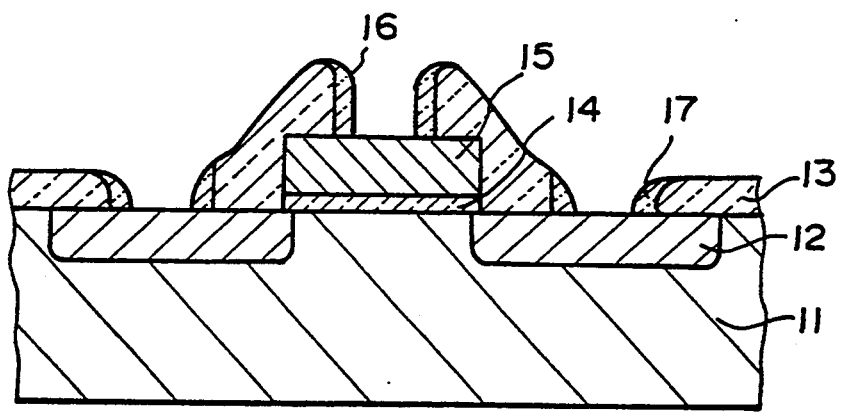

Further, as shown in FIG. 2F, an etching-back for the overall surface performed by a reactive ion-etching technique is carried out until the contact portions of the n+-diffusion layers 12 of the semiconductor substrate 11 are exposed. By doing this, it is possible to leave portions of the second insulating film as residue insulators only at the side walls of tile contact holes and to form contact holes whose edges conform to the rounded edges 16 formed by the reflow process and more gently tapered than the underlying edges rounded by the reflow process.

Next, an aluminum film containing 0.5-2% of silicon and copper is deposited to a thickness of 500 nm by a sputtering technique and, as shown in FIG. 2G, aluminum interconnects 18 of generally the same dimensions as their resist masks are formed by means of lithography and also an anisotropic dry etching technique which uses chlorine gas.

As appreciated from the above, it has been made possible to attain the desirable tapered contact holes by combining tile feature of rounding of the edges 16 of the contact holes by a reflow process with the feature of etching-back of the second insulating film 17. This method enables the tapering angles of the side surfaces of a given contact hole to be set to 90°-50° with respect to a horizontal surface, resulting in step coverage improvement of 20% to 50% for the contacts. This improvement is significant in eliminating the possibility of breakage in the interconnects otherwise caused by a poor step coverage of the conductive films involved.

In the embodiment of the invention described above, the material of tile first insulating film was explained as being BPSG, but it is to be noted that the invention is not limited to use of such material. Other glass materials which have satisfactory fellow properties, such as phosphosilicate glass (PSG), boron silicate glass (BSG), etc. can also be used. Further, it is not necessary for such an insulating film to be a single layer structure as it can be a multi-layer structure. In the latter case, however, the uppermost layer is required to be of material having good fellow properties.

Also, although the embodiment of the invention employed silicon oxide for tile second insulating film material, the present invention is neither limited to use of such material nor requires such material to have good fellow properties.

Further, by changing the amount or degree of isotropic etching during the formation of the contact holes, it is possible to change the tapering angles, formed by the fellow process, of the upper edges 16 of the contact holes. The final profile of the structure conforms to such tapering angles and such angles can be adjusted mainly by controlling the amount of isotropic etching that occurs during the formation of the contact holes.

In the embodiment of the invention, wet etching using dilute hydrofluoric acid was employed, so that by changing the amount of this etching, it is possible to change the tapering angles of tile contact holes to meet any conditions required in the use thereof.

Also, in the embodiment of the invention, only the diffusion layers and the gate electrode were provided as examples of conductive layers but it should be understood that the present invention can also be applied to the formation of interconnections between lower interconnect layers and upper interconnect layers in multilayer interconnect wiring.

As explained above, in the method for making contact holes in a semiconductor device according to the invention, a first insulating film is deposited on a semiconductor chip, a plurality of contact holes are formed by sequentially performing isotropic etching and anisotropic etching, a second insulating film is deposited after portions of the first insulating film constituting peripheries of the contact holes are subjected to a fellow process, and residue sidewall insulators are formed for the contact holes by leaving portions of the second insulating film only at sidewall portions of the contact holes when the second insulating film is etched-back by an anisotropic etching process. The structure thus obtained results in contact holes whose peripheral side walls are gently tapered, thereby improving the step coverage of the interconnect conductive material at the contact hole portions. This reduces the possibility of breakage of an interconnect wiring layer, which may otherwise be caused by poor interconnect step coverage. Therefore, the present invention not only enhances the production yield in the fabrication of the device but also improves the reliability of the product.

While the invention has been described in its preferred embodiment, it is to be understood that the words which have been used are words of description rather than limitation and that changes within the purview of the appended claims may be made without departing from the true scope and spirit of the invention in its broader aspects.

What is claimed is:

1. A method for making contact holes in a semiconductor device, comprising the steps of:
   depositing on a conductive layer of a semiconductor chip a first insulating film composed of a silicon oxide film containing phosphorus or boron;
   heating and reflowing said first insulating film;
   forming contact holes at desired positions of said first insulating film by sequentially performing isotropic etching for upper end portions of said contact holes and anisotropic etching, wherein tapering angles of said contact holes are controlled by the degree of said isotropic etching;
   heating and reflowing peripheral edges of said contact holes constituted by said first insulating film;
   depositing a second insulating film over an entire upper surface resulting from the above steps;
   etching-back said second insulating film by an anisotropic etching process; and
   forming, during the etching-back, insulating sidewall portions with residue insulators constituted by portions of said second insulating film left only at inner wall portions of said contact holes.

2. A method for making contact holes in a semiconductor device according to claim 1, in which the step of depositing said second insulating film is carried out by depositing a silicon oxide film by one of the following methods; a low pressure chemical vapor deposition method and a chemical vapor deposition method using a Si(OC$_2$H$_5$)$_4$ gas.

3. A method for making contact holes in a semiconductor device according to claim 1, in which the step of forming the contact holes by isotropic etching is carried out by means of wet etching using dilute hydrofluoric acid.

4. A method for making contact holes in a semiconductor device according to claim 3, in which said isotropic etching is controlled to adjust tapering of said residue insulators.

5. A method for fabricating a semiconductor device, comprising the steps of:
   depositing on a conductive layer of a semiconductor chip a first insulating film composed of a silicon oxide film containing phosphorus or boron;
   heating and reflowing said first insulating film;
   forming contact holes at desired positions of said first insulating film by sequentially performing isotropic etching for upper end portions of said contact holes and anisotropic etching, wherein tapering angles of said contact holes are controlled by the degree of said isotropic etching;
   heating and reflowing peripheral edges of said contact holes constituted by said first insulating film;
   depositing a second insulating film over an entire upper surface resulting from the above steps;
   etching-back said second insulating film by an anisotropic etching process;
   forming, during the etching-back, insulating sidewall portions with residue insulators constituted by portions of said second insulating film left only at inner wall portions of said contact holes; and
   forming metallization interconnects in said contact holes by depositing and patterning a conductive film.

6. A method for making contact holes in a semiconductor device according to claim 5, in which the step of depositing said second insulating film is carried out by depositing a silicon oxide film by one of the following methods: a low pressure chemical vapor deposition method and a chemical vapor deposition method using a Si(OC$_2$H$_5$)$_4$ gas.

7. A method for making contact holes in a semiconductor device according to claim 5, in which the step of forming the contact holes by isotropic etching is carried out by means of wet etching using dilute hydrofluoric acid.

8. A method for making contact holes in a semiconductor device according to claim 5, in which said isotropic etching is controlled to adjust tapering of said residue insulators.

9. A method for making contact holes in a semiconductor device according to claim 5, in which said first insulating film includes one of the following: boron phosphosilicate glass (BPSG), boron silicate glass (BSG), and phosphosilicate glass (PSG).

10. A method for making contact holes in a semiconductor device according to claim 5, in which the step of forming the contact holes by anisotropic etching is carried out by reactive ion etching.

11. A method for making contact holes in a semiconductor device according to claim 5, in which the step of etching-back said second insulating film by anisotropic etching is carried out by reactive ion etching.

12. A method for making contact holes in a semiconductor device according to claim 5, in which the step of forming metallization interconnects in said contact holes is carried out by sputtering an aluminum film containing 0.5-2% silicon and copper.

13. A method for making contact holes in a semiconductor device according to claim 5, in which said tapering angles are in the range of 90°-50° with respect to a said upper surface.

14. A method for making contact holes in a semiconductor device according to claim 1, in which said first insulating film includes one of the following: boron phosphosilicate glass (BPSG), boron silicate glass (BSG), and phosphosilicate glass (PSG).

15. A method for making contact holes in a semiconductor device according to claim 1, in which the step of forming the contact holes by anisotropic etching is carried out by reactive ion etching.

16. A method for making contact holes in a semiconductor device according to claim 1, in which the step of etching-back said second insulating film by anisotropic etching is carried out by reactive ion etching.

17. A method for making contact holes in a semiconductor device according to claim 1, in which the step of forming metallization interconnects in said contact holes is carried out by sputtering an aluminum film containing 0.5-2% silicon and copper.

18. A method for making contact holes in a semiconductor device according to claim 1, in which said tapering angles are in the range of 90°-50° with respect to a said upper surface.

* * * * *